US012492489B2

(12) United States Patent
Matsushima et al.

(10) Patent No.: US 12,492,489 B2
(45) Date of Patent: Dec. 9, 2025

(54) SINGLE CRYSTAL MANUFACTURING METHOD, MAGNETIC FIELD GENERATOR, AND SINGLE CRYSTAL MANUFACTURING APPARATUS

(71) Applicant: SUMCO Corporation, Tokyo (JP)

(72) Inventors: Naoki Matsushima, Tokyo (JP); Ryusuke Yokoyama, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 287 days.

(21) Appl. No.: 18/036,094

(22) PCT Filed: Sep. 22, 2021

(86) PCT No.: PCT/JP2021/034733

§ 371 (c)(1),
(2) Date: May 9, 2023

(87) PCT Pub. No.: WO2022/102251

PCT Pub. Date: May 19, 2022

(65) Prior Publication Data

US 2023/0407523 A1 Dec. 21, 2023

(30) Foreign Application Priority Data

Nov. 10, 2020 (JP) ................................ 2020-186976

(51) Int. Cl.
*C30B 30/04* (2006.01)
*C30B 15/10* (2006.01)
(Continued)

(52) U.S. Cl.
CPC .............. *C30B 30/04* (2013.01); *C30B 15/10* (2013.01); *C30B 15/22* (2013.01); *C30B 15/30* (2013.01);
(Continued)

(58) Field of Classification Search
CPC ......... C30B 15/10; C30B 15/22; C30B 15/30; C30B 15/305; C30B 29/06; C30B 30/04; H01F 7/064; H01F 7/20
See application file for complete search history.

(56) References Cited

U.S. PATENT DOCUMENTS 4,849,188 A 7/1989 Takasu et al.
6,423,285 B1 7/2002 Itoi et al.
(Continued)

FOREIGN PATENT DOCUMENTS

CN 201670889 12/2010
CN 109811402 A * 5/2019
(Continued)

OTHER PUBLICATIONS

Office Action issued in Corresponding KR Patent Application No. 10-2023-7013398, dated Feb. 21, 2024, along with an English translation thereof.
(Continued)

*Primary Examiner* — Hua Qi
(74) *Attorney, Agent, or Firm* — Greenblum & Bernstein, P.L.C.

(57) ABSTRACT

Provided a single crystal manufacturing method, a magnetic field generator, and a single crystal manufacturing apparatus, which allow the in-plane distribution of oxygen concentration in a single crystal to be uniform. A single crystal manufacturing method includes pulling-up a single crystal while applying a lateral magnetic field to a melt in a crucible. During a crystal pull-up process, the crucible is raised to meet the decrease in the melt, and a magnetic field distribution is controlled to meet the decrease in the melt in such a manner that the direction of the magnetic field at the melt surface and the direction of the magnetic field at the inner surface of a curved bottom portion of the crucible are
(Continued)

constant from the beginning to the end of a body section growing step.

10 Claims, 14 Drawing Sheets

(51) Int. Cl.

| | |
|---|---|
| ***C30B 15/22*** | (2006.01) |
| ***C30B 15/30*** | (2006.01) |
| ***H01F 7/06*** | (2006.01) |
| ***H01F 7/20*** | (2006.01) |
| *C30B 29/06* | (2006.01) |

(52) U.S. Cl.

CPC ............... *H01F 7/064* (2013.01); *H01F 7/20* (2013.01); *C30B 29/06* (2013.01)

(56) References Cited

U.S. PATENT DOCUMENTS

| | | | | |
|---|---|---|---|---|
| 2004/0107894 | A1* | 6/2004 | Shimonosono | C30B 15/305 117/917 |
| 2010/0170432 | A1* | 7/2010 | Furukawa | C30B 29/06 117/208 |
| 2018/0237940 | A1* | 8/2018 | Takano | C30B 30/04 |

FOREIGN PATENT DOCUMENTS

| | | |
|---|---|---|
| JP | S62-256787 | 11/1987 |
| JP | S64-24090 | 1/1989 |
| JP | 2001-203106 | 7/2001 |
| JP | 2004-51475 | 2/2004 |
| JP | 2004-323323 | 11/2004 |
| JP | 3781300 | 5/2006 |
| JP | 2007-184383 | 7/2007 |
| JP | 2009-298613 | 12/2009 |
| JP | 2017-206396 | 11/2017 |
| KR | 10-2001-0034851 | 4/2001 |
| KR | 10-2009-0012202 | 2/2009 |
| KR | 10-2018-0054615 | 5/2018 |

OTHER PUBLICATIONS

Office Action issued in Corresponding DE Patent Application No. 11-2021-005-918.1, dated Nov. 20, 2024, along with an English translation thereof.

International Search Report issued in International Patent Application No. PCT/JP2021/034733, dated Nov. 22, 2021, along with an English translation thereof.

* cited by examiner

Conventional
Magnetic Field

Combined
Magnetic Field

SINGLE CRYSTAL MANUFACTURING METHOD, MAGNETIC FIELD GENERATOR, AND SINGLE CRYSTAL MANUFACTURING APPARATUS

TECHNICAL FIELD

The present invention relates to a single crystal manufacturing method and, more particularly, to a single crystal manufacturing method according to an MCZ (Magnetic field applied Czochralski) method that pulls up a single crystal through application of a horizontal magnetic field to a melt. The present invention also relates to a magnetic field generator and a single crystal manufacturing apparatus used for the MCZ method.

BACKGROUND ART

As one of CZ methods that pull up a silicon single crystal from a silicon melt in a quartz crucible, there is known a so-called MCZ method that pulls up a silicon single crystal through application of a magnetic field to a silicon melt. The MCZ method can suppress melt convection to thereby suppress the amount of oxygen to be dissolved in a silicon melt due to reaction between the silicon melt and a quartz crucible, with the result that oxygen concentration in a silicon single crystal can be reduced to a low level.

There are several magnetic field application methods and, among them, an HMCZ method that applies a lateral magnetic field (a horizontal magnetic field) is being put into practical use. In the HMCZ method, a lateral magnetic field substantially perpendicular to the side wall of a quartz crucible is applied, so that melt convection around the wall surface of the crucible is effectively suppressed to reduce the amount of oxygen dissolved from the crucible. On the other hand, the convection suppression effect is small at a melt surface, and evaporation of oxygen (silicon oxide) from the melt surface is not suppressed significantly, so that oxygen concentration in the melt is likely to decrease. Therefore, a single crystal with a low oxygen concentration is likely to grow.

In regard to the HMCZ method, for example Patent Document 1 describes that the center position of a magnetic field is vertically moved in accordance with the progress of a pull-up process of a single crystal so as to be brought close to or separated from a melt surface so that the concentration of oxygen taken in the single crystal is controlled to decrease or increase. Further, Patent Document 2 describes that a magnetic field is generated such that magnetic flux flows along a curved bottom of a crucible.

Patent Document 3 describes a single crystal manufacturing apparatus capable of pulling-up not only a single crystal having a low oxygen concentration and reduced growth striations but also a single crystal having a high oxygen concentration by using a magnetic field generator capable of generating and switching two magnetic fields whose directions of magnetic force lines are shifted by 90° and whose magnetic field distributions differ from each other.

RELATED ART

Patent Literature

Patent Literature 1: Japanese Patent Laid-open Publication No. 2004-323323

Patent Literature 2: Japanese Patent Laid-open Publication No. S62-256787

Patent Literature 3: Japanese Patent Laid-open Publication No. 2017-206396

SUMMARY OF THE INVENTION

Problem to be Solved by the Invention

In the HMCZ method, the horizontal magnetic field to be applied around the melt surface preferably travels straight parallel to the melt surface. This is because a magnetic field component perpendicular to the melt surface suppresses melt convection at the melt surface to cause an increase in oxygen concentration, as described above. On the other hand, at the crucible bottom, a magnetic field preferably travels while curving along the curved bottom. This is because a magnetic field component perpendicular to the crucible inner wall surface suppresses melt convection to make diffusion of oxygen in the melt insufficient, easily causing unevenness of oxygen concentration in a single crystal. Therefore, as described in Patent Document 2, to generate a magnetic field curved along the bottom surface of the crucible is effective.

However, during a crystal pull-up process, it is necessary to lift the quartz crucible in accordance with a reduction in the melt associated with crystal growth to maintain the height position of the melt surface constant. When the quartz crucible is lifted up, the positional relation between a magnetic field distribution and the quartz crucible changes, making it difficult to make the magnetic field follow the curved bottom surface of the quartz crucible. As described in Patent Document 1, it is possible to lift up the center position of the magnetic field such that a magnetic field distribution follows the curved bottom surface of the crucible; however, in this case, the magnetic field does not horizontally travel around the melt surface, which disadvantageously increases oxygen concentration in the single crystal due to stagnation of melt convection around the melt surface.

A variation in the oxygen concentration distribution of the silicon single crystal in the crystal growth direction has influence on the in-plane distribution of oxygen concentration in a silicon wafer. As illustrated in FIG. 14, when a wafer is cut from a silicon single crystal having growth striations of the oxygen concentration distribution in the crystal growth direction, the in-plane distribution of the wafer oxygen concentration becomes nonuniform.

An object of the present invention is therefore to provide a single crystal manufacturing method capable of making the in-plane distribution of oxygen concentration in a single crystal uniform. Another object of the present invention is to provide a magnetic field generator and a single crystal manufacturing apparatus used for such a single crystal manufacturing method.

Means for Solving the Problem

To solve the above problems, the present inventors have studied about a variation in oxygen concentration in the single crystal and have found that the growth striations of the oxygen concentration become reduced in a specific range in the crystal growth direction and a variation in the crystal diameter is very small in that range. Further study has revealed that the direction of magnetic force lines around a crucible bottom portion is almost parallel to the crucible bottom surface in the growing state of a single crystal in the range where the growth striations of the oxygen concentration become reduced.

The present invention has been made based on such technical findings, and a single crystal manufacturing method according to the present invention is a method of pulling-up a single crystal while applying a lateral magnetic field to a melt in a crucible and includes lifting the crucible in accordance with a reduction in the melt during a crystal pull-up process and controlling a magnetic field distribution in accordance with a reduction in the melt so as to make constant the direction of a magnetic field at a melt surface and the direction of the magnetic field at the inner surface of a curved bottom portion of the crucible from start to end of a body section growing step.

According to the single crystal manufacturing method of the present invention, the direction of the magnetic field around the melt surface and the direction of the magnetic field around the crucible bottom portion are maintained constant from early stage to final stage of the body section growing step, so that melt convection having influence on oxygen concentration in the single crystal can be suppressed as much as possible, whereby it is possible not only to reduce oxygen concentration in the single crystal but also to make the in-plane distribution of oxygen concentration uniform.

In the present invention, the direction of the magnetic field at the melt surface is preferably parallel to the melt surface. The melt surface is the interface (liquid-solid interface) between the melt and atmosphere in a pull-up furnace and is normally horizontal. This activates evaporation of oxygen from the melt surface to thereby reduce oxygen concentration in the single crystal.

Assume that the rotary axis of the crucible is defined as Z-axis, the magnetic field center axis of the lateral magnetic field orthogonal to the Z-axis is defined as Y-axis, the intersection between the Z-axis and the Y-axis is set to the origin, and the axis orthogonal to the YZ plane and passing the origin is defined as X-axis. In this case, on the intersection line between the inner surface of the curved bottom portion of the crucible and the YZ plane, an angle θ formed by a normal vector of the inner surface and a magnetic field vector is preferably maintained at equal to or more than 75° and equal to or less than 105°. This suppresses melt convection at the crucible bottom portion to allow the in-plane distribution of oxygen concentration in the single crystal to be uniform.

In the single crystal manufacturing method according to the present invention, the magnetic field distribution is preferably adjusted so as to minimize, at the curved bottom portion of the crucible, an integrated value of the square of the inner product value of the normal vector of the inner surface of the crucible curved bottom portion and magnetic field vector. Alternatively, the magnetic field distribution may be adjusted so as to make the crucible bottom shape and the second-order differential of the magnetic field in the Y-direction coincide with each other at the center of the bottom portion. This can make the direction of the magnetic field around the crucible bottom portion to follow the curved inner surface of the bottom portion.

Assuming that the radius of the crucible is R, the bottom portion is preferably defined in the range of 0.7R or less from the center of the bottom portion. Normally, in a single crystal pull-up process under application of a lateral magnetic field where the magnetic field distribution has no distortion, the magnetic field distribution around the center is almost parallel to the crucible bottom surface, so that when the set area of the bottom portion is small, the present invention is automatically satisfied and does not make sense. When the set area of the bottom portion is larger than 0.7R, it is difficult to satisfy the above condition at the corner portion of the crucible where the curvature radius significantly changes toward the side wall portion.

The single crystal manufacturing method according to the present invention preferably includes a plurality of coil elements around the crucible and individually adjusts the magnetic intensity of the coil elements so as to control the magnetic field distribution. In this case, the plurality of coil elements preferably constitute a plurality of coil element pairs with their axes meeting each other. According to the present invention, it is possible to change the direction of the magnetic field around the crucible bottom portion in accordance with a change in the height position of the crucible while maintaining the direction of the magnetic field at the melt surface horizontal.

The plurality of coil elements are preferably disposed symmetrically with respect to the XZ plane and parallel to the XY plane. According to the present invention, it is possible to achieve a magnetic field distribution having a high degree of symmetry as viewed in the Z-axis.

The plurality of coil elements preferably constitute a first coil device generating a first magnetic field and a second coil device generating a second magnetic field different from the first magnetic field. With this configuration, it is preferable to control the magnetic field distribution by individually adjusting the intensity of the first magnetic field and the intensity of the second magnetic field. This makes it possible to change the direction of the magnetic field around the crucible bottom portion in accordance with a change in the height position of the crucible while maintaining the direction of the magnetic field at the melt surface horizontal.

The first magnetic field preferably changes such that the magnetic field intensity thereof in the Y-axis positive direction gradually decreases and then becomes zero, followed by a gradual increase in the magnetic field intensity in the Y-axis negative direction, and the second magnetic field preferably changes such that the magnetic field intensity thereof in the Y-axis negative direction gradually decreases and then becomes zero, followed by a gradual increase in the magnetic field intensity in the Y-axis positive direction. This makes it possible to change the direction of the magnetic field around the crucible bottom portion in accordance with a change in the height position of the crucible while maintaining the direction of the magnetic field at the melt surface horizontal.

A magnetic field generator according to the present invention is an apparatus used in the manufacture of a single crystal according to an MCZ method and configured to apply a lateral magnetic field to a melt in a crucible, the apparatus including a first coil device generating a first magnetic field and a second coil device generating a second magnetic field different from the first magnetic field, wherein assuming that the rotary axis of the crucible is defined as Z-axis, the magnetic field center axis of the lateral magnetic field orthogonal to the Z-axis is defined as Y-axis, the intersection between the Z-axis and the Y-axis is set to the origin, and the axis orthogonal to the YZ plane and passing the origin is defined as X-axis, the first coil device has at least one pair of coil elements disposed on the YZ plane and whose coil axes coincide with each other, the second coil device has at least two pairs of coil elements disposed parallel to the XY plane and whose coil axes coincide with one another, and the plurality of coil elements constituting the first and second coil devices are disposed symmetrically with resect to the XZ plane.

According to the present invention, it is possible to change the direction of the magnetic field around the crucible bottom portion in accordance with a change in the height position of the crucible while maintaining the direction of the magnetic field at the melt surface horizontal. By maintaining such a magnetic field distribution constant from early stage to final stage of a body section growing step, melt convection having influence on oxygen concentration in the single crystal can be suppressed as much as possible, whereby it is possible not only to reduce oxygen concentration in the single crystal but also to make the in-plane distribution of oxygen concentration uniform.

In the present invention, the first coil device preferably has first and second coil elements disposed on the YZ plane so as to be symmetric with respect to the z-axis, the second coil device preferably has third and fourth coil elements disposed on the XY plane so as to be symmetric with respect to the Z-axis and fifth and sixth coil elements disposed on the XY plane so as to be symmetric with respect to the Z-axis, and the first to sixth coil elements are preferably disposed symmetrically with respect to the XY plane. This can achieve a magnetic field distribution having a high symmetry as viewed in the Z-axis.

An angle formed by the coil axis of each of the third and fourth coil elements and the Y-axis is preferably +45°, and an angle formed by the coil axis of each of the fifth and sixth coil elements and the Y-axis is preferably −45°. This can achieve a magnetic field distribution having a high degree of symmetry as viewed in the Z-axis.

Loop coils constituting respectively the first and second coil elements preferably have the same loop size, and loop coils constituting respectively the third and sixth coil elements preferably have the same loop size. This can achieve a magnetic field distribution having a high degree of symmetry as viewed in the Z-axis.

Further, a single crystal manufacturing apparatus according to the present invention includes: a crucible holding a melt; a heater heating the melt; a crystal pull-up mechanism pulling-up a single crystal from the melt; a crucible lifting/lowering mechanism rotating and lifting/lowering the crucible; the above-described magnetic field generator according to the present invention that applies a lateral magnetic field to the melt; and a controller controlling the heater, the crystal pull-up mechanism, the crucible lifting/lowering mechanism, and the magnetic field generator.

The single crystal manufacturing apparatus according to the present invention maintains constant the direction of a magnetic field around the melt surface and the direction of the magnetic field around the crucible bottom portion irrespective of a change in the height position of the crucible during a body section growing step, so that melt convection having influence on oxygen concentration in the single crystal can be suppressed as much as possible, whereby it is possible not only to reduce oxygen concentration in the single crystal but also to make the in-plane distribution of oxygen concentration uniform.

Effects of the Invention

According to the present invention, there can be provided a single crystal manufacturing method, a magnetic field generator, and a single crystal manufacturing apparatus capable of making the in-plane distribution of oxygen concentration in the single crystal uniform.

BRIEF DESCRIPTION OF THE DRAWINGS

FIGS. 4A to 4C are schematic perspective views illustrating the configuration of the magnetic field generator 20 according to a first embodiment of the present invention, in which FIG. 4A illustrates the entire configuration of the magnetic field generator, FIG. 4B illustrates the configuration of a first coil device, and FIG. 4C illustrates the configuration of a second coil device.

FIGS. 7A to 7C are schematic perspective views illustrating the configuration of the magnetic field generator 20 according to a second embodiment of the present invention, in which FIG. 7A illustrates the entire configuration of the magnetic field generator, FIG. 7B illustrates the configuration of the first coil device, and FIG. 7C illustrates the configuration of the second coil device.

FIGS. 8A to 8C are schematic perspective views illustrating the configuration of the magnetic field generator 20 according to a third embodiment of the present invention, in which FIG. 8A illustrates the entire configuration of the magnetic field generator, FIG. 8B illustrates the configuration of the first coil device, and FIG. 8C illustrates the configuration of the second coil device.

FIGS. 9A to 9C are schematic perspective views illustrating the configuration of the magnetic field generator 20 according to a fourth embodiment of the present invention, in which FIG. 9A illustrates the entire configuration of the magnetic field generator, FIG. 9B illustrates the configuration of the first coil device, and FIG. 9C illustrates the configuration of the second coil device.

FIGS. 10A and 10B are graphs showing the relationship between the magnetic field output, in which FIG. 10A shows the relationship between the melt depth (the distance from the liquid surface to the bottom of the crucible) and the magnetic field output, and FIG. 10B shows the relationship between crystal length and magnetic field output.

FIGS. 11A to 11C are graphs illustrating an angle θ formed by the magnetic force lines of the combined magnetic field generated using the magnetic field output profile illustrated in FIGS. 10A and 10B and inner surface of the crucible bottom portion in comparison with the magnetic field generated when each of the first and second coil devices operates alone, in which FIG. 11A shows a case in the melt depth of 200 mm, FIG. 11B shows a case in the melt depth of 300 mm, and FIG. 11C shows a case in the melt depth of 400 mm.

FIGS. 13A to 13F are graphs illustrating evaluation results about oxygen concentration in silicon single crystals according to a comparative example and an example, in which FIGS. 13A to 13C are evaluation results about oxygen concentration in a silicon single crystal according to a comparative example produced through application of a single magnetic field, and FIGS. 13D to 13F are evaluation results about oxygen concentration in the silicon single crystal according to the example produced through application of the combined magnetic field.

MODE FOR CARRYING OUT THE INVENTION

Hereinafter, preferred embodiments of the present invention will be described in detail with reference to the accompanying drawings.

Figure 1:
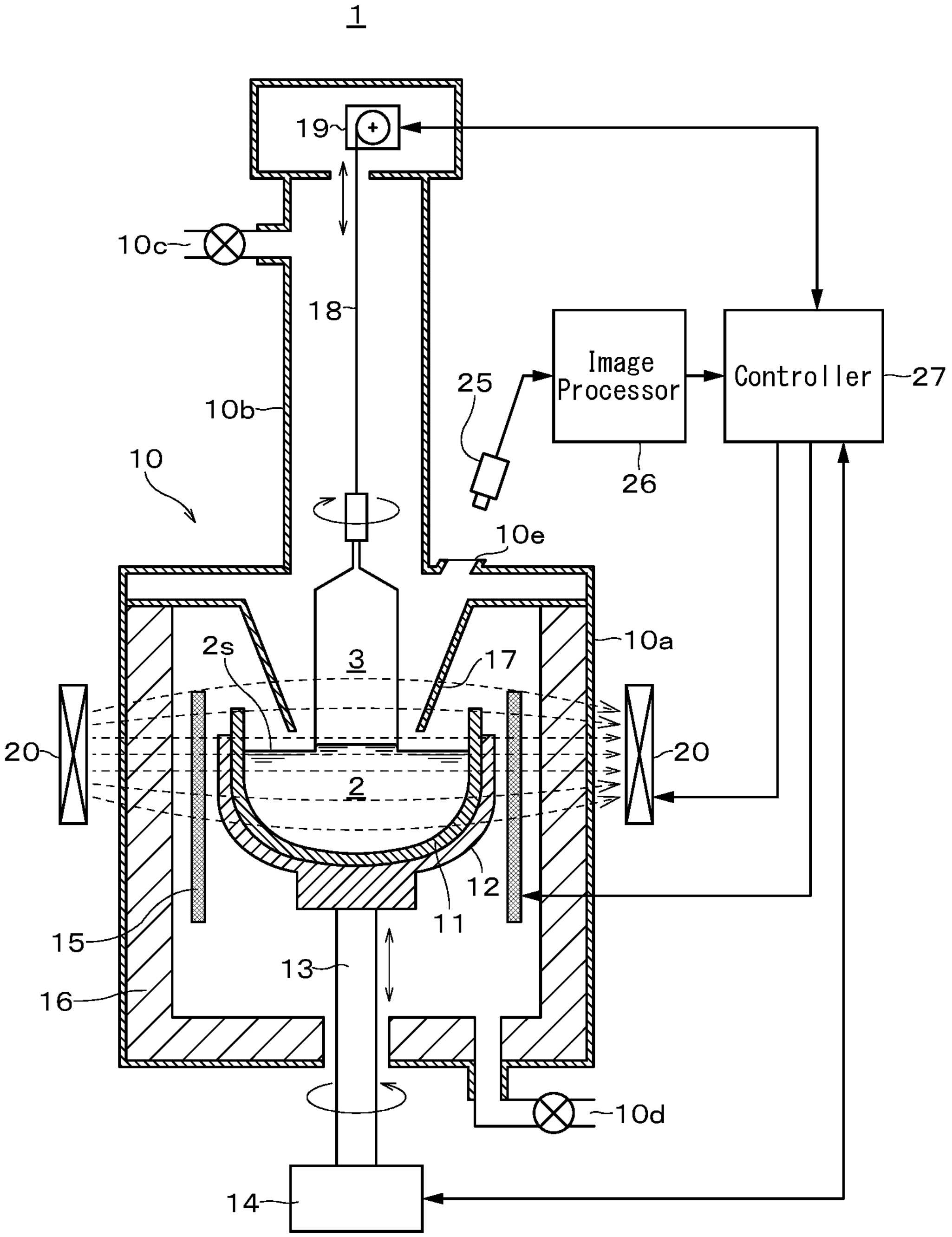
FIG. 1 is a cross-sectional side view schematically illustrating the configuration of a single crystal manufacturing apparatus according to an embodiment of the present invention.

FIG. 1 is a cross-sectional side view schematically illustrating the configuration of a single crystal manufacturing apparatus according to an embodiment of the present invention.

As illustrated in FIG. 1, a single crystal manufacturing apparatus 1 includes a chamber 10, a quartz crucible 11 holding a silicon melt 2 in the chamber 10, a graphite susceptor 12 supporting the quartz crucible 11, a rotary shaft 13 supporting the susceptor 12, a shaft drive mechanism 14 for rotating and lifting/lowering the rotary shaft 13, a heater 15 disposed around the susceptor 12, a heat insulating material 16 disposed outside the heater 15 and along the inner surface of the chamber 10, a heat shielding body 17 disposed above the quartz crucible 11, a single crystal pull-up wire 18 disposed above the quartz crucible 11 so as to be coaxial with the rotary shaft 13, and a wire winding mechanism 19 disposed above the chamber 10.

The single crystal manufacturing apparatus 1 further includes a magnetic field generator 20 disposed outside the chamber 10, a CCD camera 25 for photographing the inside of the chamber 10, an image processor 26 for processing an image photographed by the CCD camera 25, a controller 27 for controlling the shaft drive mechanism 14, heater 15, and wire winding mechanism 19 based on an output from the image processor 26.

The chamber 10 is constituted of a main chamber 10*a* and an elongated cylindrical pull chamber 10*b* connected to an upper opening of the main chamber 10*a*, and the quartz crucible 11, susceptor 12, heater 15, and heat shielding body 17 are provided inside the main chamber 10*a*. A gas inlet 10*c* for introducing inert gas (purge gas) such as argon gas into the chamber 10 is formed in the pull chamber 10*b*, and a gas outlet 10*d* for discharging the inert gas is formed at the lower part of the main chamber 10*a*. Further, an observation window 10*e* is formed at the upper portion of the main chamber 10*a* to allow a growing state (solid-liquid interface) of a silicon single crystal 3 to be observed therethrough.

The quartz crucible 11 is a quartz glass container having a cylindrical side wall part, a gradually curved bottom part, and a corner part positioned between the side wall part and the bottom part. The susceptor 12 tightly contacts the outer surface of the quartz crucible 11 to cover and hold the quartz crucible 11 so as to maintain the shape of the quartz crucible 11 soften by heating. The quartz crucible 11 and susceptor 12 constitute a double-structured crucible that supports the silicon melt in the chamber 10.

The susceptor 12 is fixed to the upper end portion of the vertically extending rotary shaft 13. The lower end portion of the rotary shaft 13 penetrates the center of the bottom part of the chamber 10 to be connected to the shaft drive mechanism 14 provided outside the chamber 10. The susceptor 12, rotary shaft 13, and shaft drive mechanism 14 constitute a crucible lifting/lowering mechanism for lifting and lowering the quartz crucible 11 while rotating the same.

The heater 15 is used to melt a silicon raw material filled in the quartz crucible 11 and maintain the molten state thereof. The heater 15 is a resistance heating type heater made of carbon and is a substantially cylindrical member provided so as to surround the entire periphery of the quartz crucible 11 in the susceptor 12. The heater 15 is surrounded by the heat insulating material 16, whereby heat retention performance inside the chamber 10 can be enhanced.

The heat shielding body 17 is provided for suppressing a variation in temperature of the silicon melt 2 to form an adequate hot zone around the sold-liquid interface and preventing the silicon single crystal 3 from being heated by radiation heat from the heater 15 and quartz crucible 11. The heat shielding body 17 is a graphite cylindrical member covering an area above the silicon melt 2 excluding a pull-up path for the silicon single crystal 3.

A circular opening having a diameter larger than the diameter of the silicon single crystal 3 is formed at the center of the lower end portion of the heat shielding body 17, thus ensuring the pull-up path for the silicon single crystal 3. As illustrated, the silicon single crystal 3 is pulled upward through the opening. The diameter of the opening of the heat shielding body 17 is smaller than the aperture diameter of the quartz crucible 11, and the lower end portion of the heat shielding body 17 is positioned inside the quartz crucible 11, so that even when the rim upper end of the quartz crucible 11 is lifted up beyond the lower end of the heat shielding body 17, the heat shielding body 17 does not interfere with the quartz crucible 11.

The amount of melt in the quartz crucible 11 decreases with the growth of the silicon single crystal 3; however, by lifting the quartz crucible 11 so as to maintain a gap between a melt surface 2*s* and the heat shielding body 17 constant, it is possible to suppress a variation in temperature of the silicon melt 2 and to make the flow rate of a gas flowing around the melt surface 2*s* (purge gas guiding line) constant, whereby the evaporation amount of a dopant from the silicon melt 2 can be controlled. This makes it possible to enhance the stability of a crystal defect distribution, an oxygen concentration distribution, a resistivity distribution, etc., in the pull-up axis direction of the single crystal.

The wire 18 serving as the pull-up axis of the silicon single crystal 3 and the wire winding mechanism. 19 for winding the wire 18 are provided above the quartz crucible 11 to constitute a crystal pull-up mechanism. The wire winding mechanism 19 has a function of rotating the silicon single crystal together with the wire 18. The wire winding mechanism 19 is provided at the upper portion of the pull chamber 10*b*. The wire 18 extends downward from the wire winding mechanism 19, passing through the pull chamber 10*b* until the leading end thereof reaches the inner space of the main chamber 10*a*. FIG. 1 illustrates a state where the silicon single crystal 3 being grown is suspended by the wire 18. Upon pull-up of the single crystal, a seed crystal is immersed in the silicon melt 2, and the wire 18 is gradually pulled up while the quartz crucible 11 and seed crystal are being rotated to grow the single crystal.

The magnetic field generator 20 is constituted by a plurality of coils provided around the quartz crucible 11 and applies a lateral magnetic field (a horizontal magnetic field) to the silicon melt 2. The maximum intensity of the lateral magnetic field on the rotary axis (extension line of the crystal pull-up axis) of the quartz crucible 11 is preferably 0.15 (T) to 0.6 (T) which is a typical range of the magnetic field intensity of the HMCZ. Applying the magnetic field to the silicon melt 2 can suppress melt convection in a direction perpendicular to magnetic force lines. Therefore, it is possible to suppress dissolution of oxygen from the quartz crucible 11 and to thereby reduce oxygen concentration in a silicon single crystal.

The observation window 10*e* for observing the inside of the chamber 10 is provided at the upper portion of the main chamber 10*a*, and the CCD camera 25 is installed outside the observation window 10*e*. During a single crystal pull-up process, the CCD camera 25 photographs an image of a boundary portion between the silicon single crystal 3 and the silicon melt 2 which can be viewed from the observation window 10*e* through an opening 17*a* of the heat shielding body 17. The CCD camera 25 is connected to the image processor 26. The photographed image is processed in the image processor 26, and processing results are used for control of crystal pull-up conditions in the controller 27.

Figure 2:
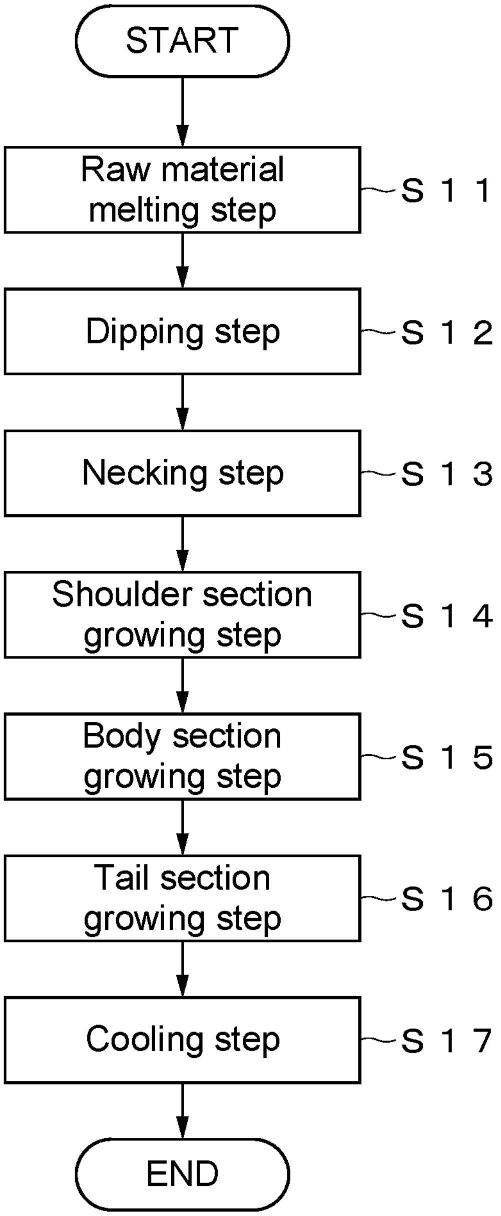
FIG. 2 is a flowchart for explaining a silicon single crystal manufacturing method according to the embodiment of the present invention.
Figure 3:
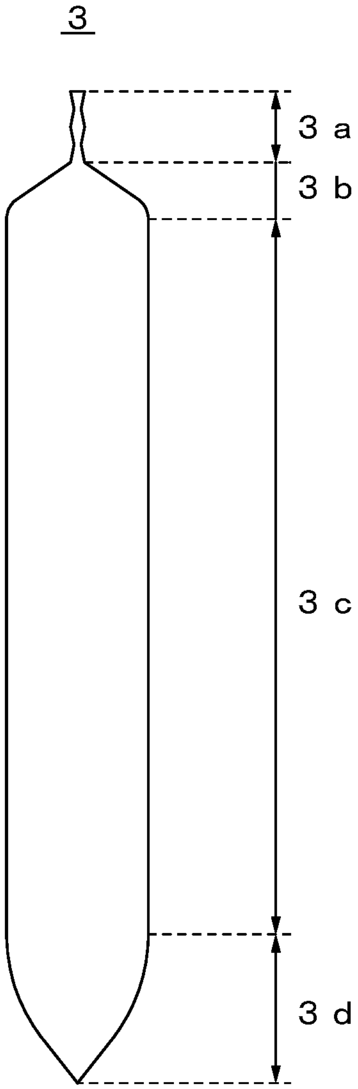
FIG. 3 is a schematic cross-sectional view illustrating the shape of a silicon single crystal ingot.

FIG. 2 is a flowchart for explaining a silicon single crystal manufacturing method according to the embodiment of the present invention. FIG. 3 is a schematic cross-sectional view illustrating the shape of a silicon single crystal ingot.

As illustrated in FIGS. 2 and 3, in the manufacturing process of the silicon single crystal 3, a silicon raw material in the quartz crucible 11 is heated up to generate the silicon melt 2 (step S11). After that, a seed crystal attached to the leading end portion of the wire 18 is lowered to be dipped into the silicon melt 2 (step S12).

Then, a single crystal pull-up process is performed, in which the seed crystal is gradually pulled up while being in contact with the silicon melt 2 to grow a single crystal. In the single crystal pull-up process, a necking step (step S13) of forming a neck section 3*a* whose crystal diameter is narrowed so as to avoid dislocation, a shoulder section growing step (step S14) of forming a shoulder section 3*b* whose crystal diameter is gradually increased up to a specified diameter, a body section growing step (step S15) of forming a body section 3*c* whose crystal diameter is kept constant, and a tail section growing step (step S16) of forming a tail section 3*d* whose crystal diameter is gradually reduced are sequentially performed. Finally, the silicon single crystal 3 is separated from the melt surface 2*s* to end the tail section growing step. Through the above steps, a silicon single crystal ingot 3 having the neck section 3*a*, shoulder section 3*b*, body section 3*c*, and tail section 3*d* sequentially from the upper end to the lower end of the single crystal is completed.

During the single crystal pull-up process, in order to control the diameter of the silicon single crystal 3 and the liquid surface position of the silicon melt 2, an image of the boundary portion between the silicon single crystal 3 and the silicon melt 2 is photographed using the CCD camera 25, and the diameter of the silicon single crystal 3 at the solid-liquid surface and a gap between the melt surface 2*s* and the heat shielding body 17 are calculated from the photographed image. The controller 27 controls pull-up conditions such as a pull-up speed of the wire 18 and power of the heater 15 so that the diameter of the silicon single crystal 3 becomes a target value. Further, the controller 27 controls the height position of the quartz crucible 11 so as to make the gap between the melt surface 2*s* and the heat shielding body 17 constant.

The following describes in detail the configuration of the magnetic field generator 20.

Figure 4A:
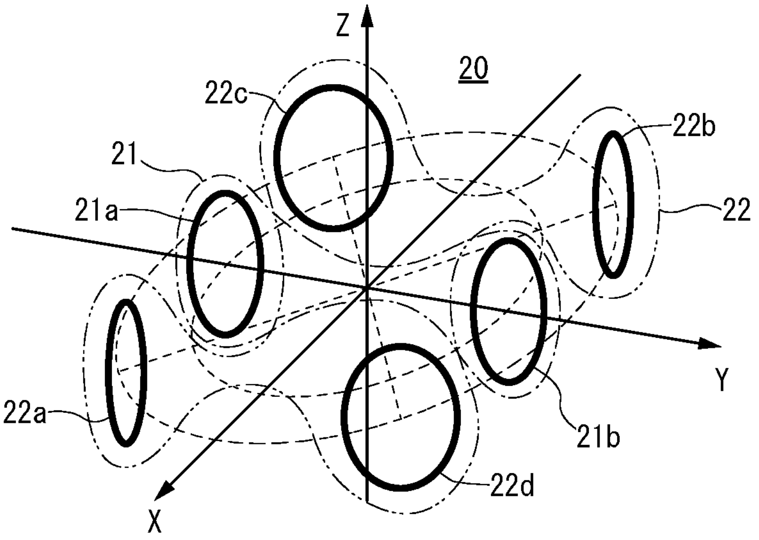
Figure 4B:
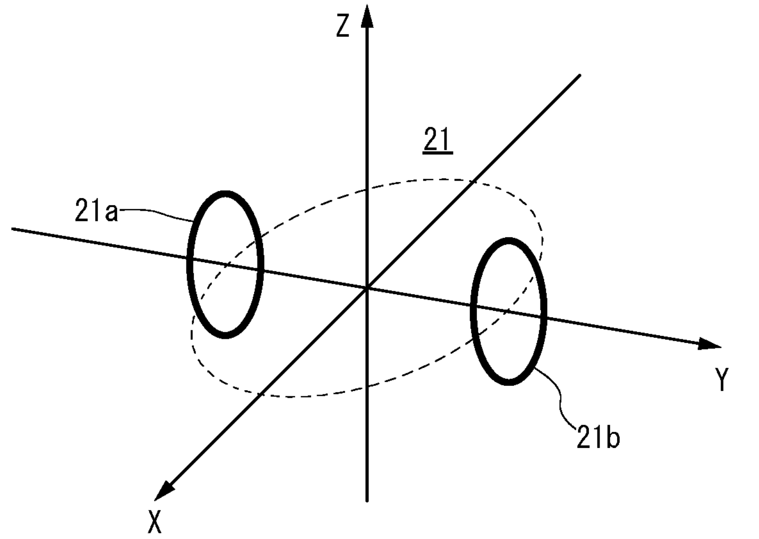
Figure 4C:
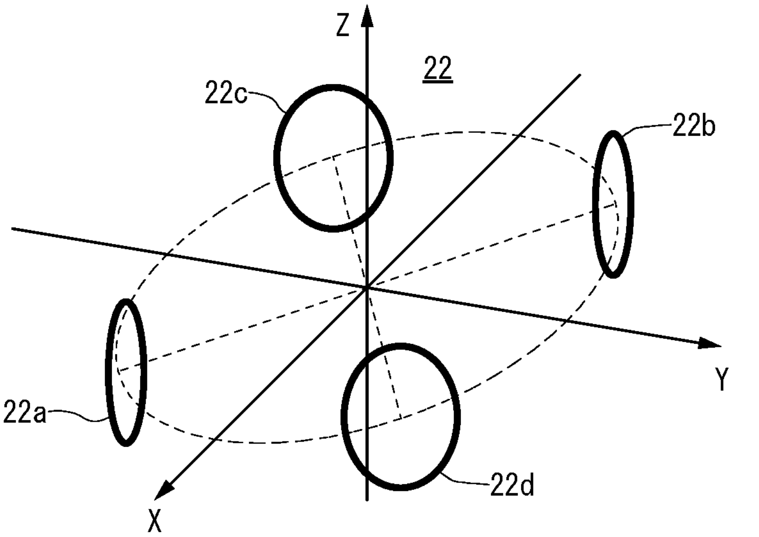

FIGS. 4A to 4C are schematic perspective views illustrating the configuration of the magnetic field generator 20 according to a first embodiment of the present invention. FIG. 4A illustrates the entire configuration of the magnetic field generator 20, FIG. 4B illustrates the configuration of a first coil device 21, and FIG. 4C illustrates the configuration of a second coil device 22.

As illustrated in FIG. 4A, the magnetic field generator 20 is constituted by a combination of a first coil device 21 generating a first lateral magnetic field and a second coil device 22 generating a second lateral magnetic field different from the first lateral magnetic field. Assuming that the rotary axis (crystal center axis) of the quartz crucible 11 coincides with the Z-axis and that the intersection between the Z-axis and the melt surface coincides with the origin of an orthogonal coordinate system, the application direction of the lateral magnetic field is the Y-direction. By thus preparing the two coil devices and independently changing the intensity of the lateral magnetic field generated by each of the two coils, it is possible to change a magnetic field distribution in accordance with the rising of the quartz crucible 11.

As illustrated in FIG. 4B, the first coil device 21 has a pair of loop coil elements. In more detail, the first coil device 21 has a first coil element 21*a* and a second coil element 21*b* opposed to the first coil element 21*a* across the Z-axis. The first and second coil elements 21*a* and 21*b* are disposed on the negative and positive sides in the Y-axis direction, respectively. In particular, the first and second coil elements 21*a* and 21*b* are disposed symmetrically with respect to the XZ plane.

The first and second coil elements 21*a* and 21*b* are the same in loop size and have a relatively large diameter. The coil axis (coil center axis) of each of the first and second coil elements 21*a* and 21*b* coincides with the Y-axis. Thus, the center axis of a magnetic field generated from the first coil device 21 coincides with the Y-axis.

The first coil device 21 operates such that the magnetic field generation directions of the pair of coil elements coincide with each other. That is, when a magnetic field in the Y-axis positive direction needs to be generated from the first coil device 21, the magnetic field directions of both the first and second coil elements 21*a* and 21*b* are set to the Y-axis positive direction (direction directed from the first coil element 21*a* toward the second coil element 21*b*). Conversely, when a magnetic field in the Y-axis negative direction needs to be generated, the magnetic field directions of both the first and second coil elements 21*a* and 21*b* are set to the Y-axis negative direction (direction directed from the second coil element 21*b* toward the first coil element 21*a*).

As illustrated in FIG. 4C, the second coil device 22 has two pairs of loop coil elements. In more detail, the second coil device 22 has a third coil element 22*a*, a fourth coil element 22*b* opposed to the third coil element 22*a* across the Z-axis, a fifth coil element 22*c*, and a sixth coil element 22*d* opposed to the fifth coil element 22*c* across the Z-axis. The third and fifth coil elements 22*a* and 22*c* are disposed on the negative side in the Y-axis direction, and the fourth and sixth coil elements 22*b* and 22*d* are disposed on the positive side in the Y-axis direction. In particular, the third and fifth coil elements 22*a*, 22C and the fourth and sixth coil elements 22*b*, 22*d* are disposed symmetrically with respect to the XZ plane.

The third to sixth coil elements 22*a* to 22*d* are the same in loop size and have the same loop size as those of the first and second coil elements 21*a* and 22*b*. The coil axis of each of the third and fourth coil elements 22*a* and 22*b* exists in the XY plane and is inclined counterclockwise at 45° (+45°) with respect to the Y-axis. The coil axis of each of the fifth and sixth coil elements 22*c* and 22*d* also exists in the XY plane and is inclined clockwise at 45° (−45°) with respect to the Y-axis. Therefore, the coil axes of the fifth and sixth coil elements 22*c* and 22*d* are orthogonal to the coil axes of the third and fourth coil elements 22*a* and 22*b*.

The second coil device 22 also operates such that the magnetic field generation directions of the pair of coil elements coincide with each other. That is, when a magnetic field in the Y-axis positive direction needs to be generated from the second coil device 22, the magnetic field directions of both the third and fourth coil elements 22*a* and 22*b* are set to the Y-axis positive direction (direction directed from the third coil element 22*a* toward the fourth coil element 22*b*), and the magnetic field directions of both the fifth and sixth coil elements 22*c* and 22*d* are set to the Y-axis positive direction (direction directed from the fifth coil element 22*c* toward the sixth coil element 22*d*). As a result, a combined magnetic field between the third to sixth coil elements 22*a* to 22*d* is directed in the Y-axis positive direction. Conversely, when a magnetic field in the Y-axis negative direction needs to be generated, the magnetic field directions of both the third and fourth coil elements 22*a* and 22*b* are set to the Y-axis negative direction (direction directed from the fourth coil element 22*b* toward the third coil element 22*a*), and the magnetic field directions of both the fifth and sixth coil elements 22*c* and 22*d* are set to the Y-axis negative direction (direction directed from the sixth coil element 22*d* toward the fifth coil element 22*c*). As a result, a combined magnetic field between the third to sixth coil elements 22*a* to 22*d* is directed in the Y-axis negative direction.

Figure 5:
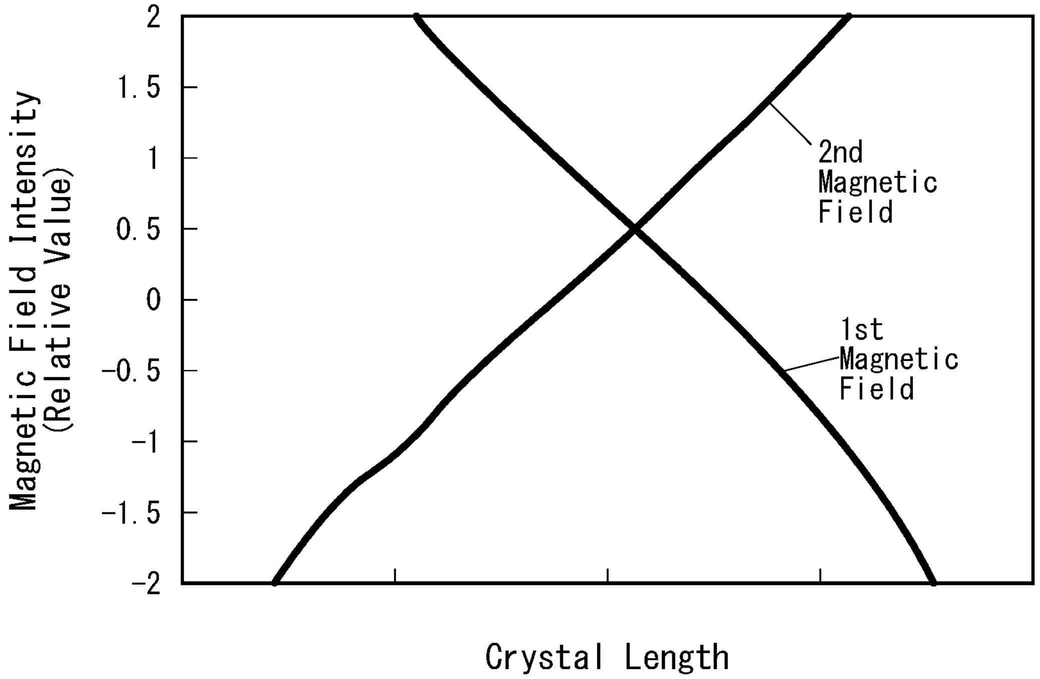
FIG. 5 is a graph illustrating a change in the intensity of magnetic fields generated from the first coil device 21 and the second coil device 22.

FIG. 5 is a graph illustrating a change in the intensity of a magnetic field generated from the first coil device 21 and that of a magnetic field generated from the second coil device 22.

As illustrated in FIG. 5, in the early stage of a crystal pull-up process, a relatively large magnetic field directed in the Y-axis positive direction is applied from the first coil device 21, and a relatively large magnetic field directed in the Y-axis negative direction is applied from the second coil device 22.

Thereafter, along with the progress of crystal growth, the magnetic field (first magnetic field) generated from the first coil device 21 is gradually reduced in intensity, while the magnetic field (second magnetic field) generated from the second coil device 22 is gradually increased in intensity. The magnetic field generated from the first coil device 21 changes such that the magnetic field in the Y-axis positive direction is gradually reduced in intensity to zero, followed by reversal of the direction, and the magnetic field in the Y-axis negative direction is gradually increased in intensity. The magnetic field generated from the second coil device 22 changes such that the magnetic field in the Y-axis negative direction is gradually reduced in intensity to zero, followed by reversal of the direction, and the magnetic field in the Y-axis positive direction is gradually increased in intensity. Accordingly, in the final stage of the crystal pull-up process, a relatively large magnetic field directed in the Y-axis negative direction is applied from the first coil device 21, and a relatively large magnetic field directed in the Y-axis positive direction is applied from the second coil device 22. The timing at which the magnetic field profile of the first coil device 21 becomes zero and the timing at which the magnetic field profile of the second coil device 22 becomes zero do not coincide with each other.

Figure 6A:
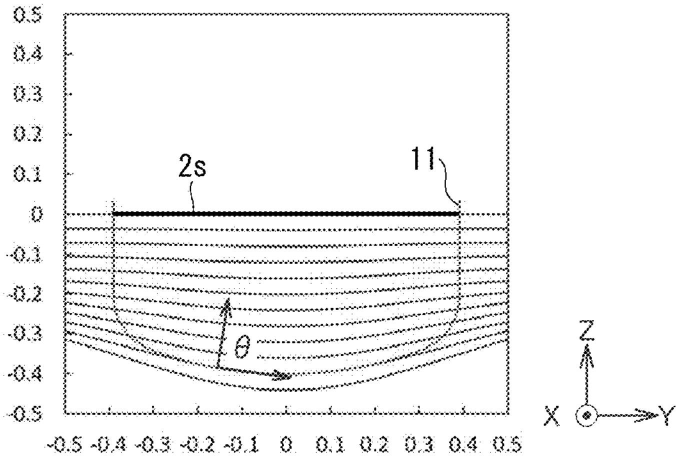
FIGS. 6A to 6C are schematic views illustrating the vector distribution of the combined magnetic field applied to the silicon melt in the quartz crucible.
Figure 6B:
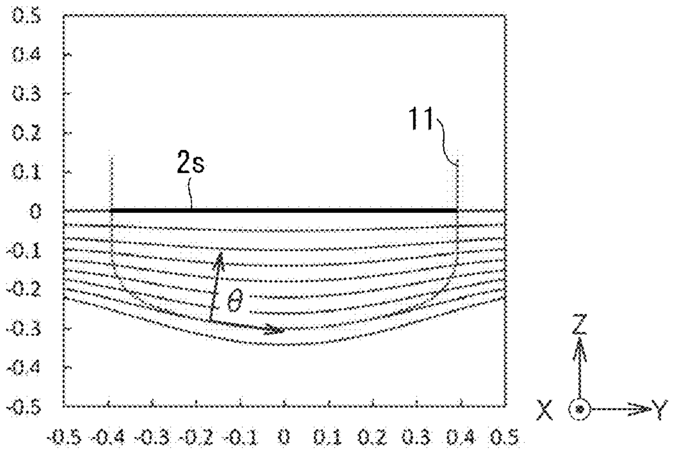
Figure 6C:
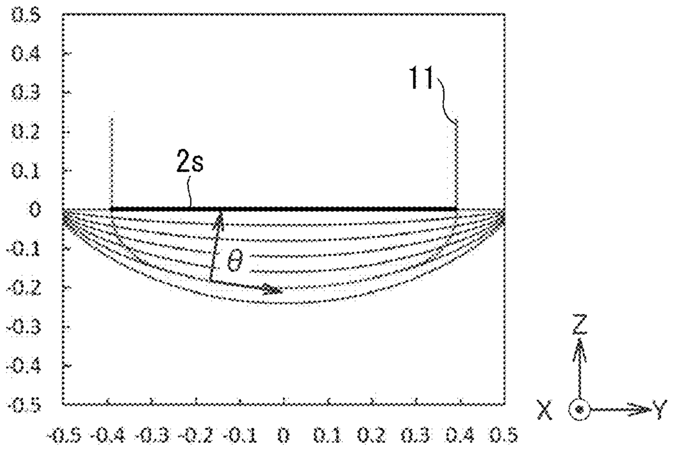

FIGS. 6A to 6C are schematic views illustrating the vector distribution of the combined magnetic field applied to the silicon melt 2 in the quartz crucible 11. In FIGS. 6, only the magnetic field around the silicon melt is illustrated, and the magnetic field spreading to the surroundings of the silicon melt is omitted. Further, the silicon single crystal 3 pulled up from the melt surface 2*s* is also omitted.

In the early stage of the crystal pull-up process illustrated in FIG. 6A, the residual amount of the silicon melt in the quartz crucible 11 is large, and thus the melt surface 2*s* is sufficiently separated from the crucible bottom portion. The melt surface 2*s* refers to a gas-liquid interface and is distinguished from the interface between the silicon melt 2 and the quartz crucible 11. At this time, by applying the magnetic field intensity profile of FIG. 5 when the crystal length is short, the direction of the magnetic field to be applied around the crucible bottom portion can be made to follow the curved shape of the crucible bottom portion.

In the middle stage of the crystal pull-up process illustrated in FIG. 6B, the silicon melt in the quartz crucible 11 decreases, and the melt surface 2*s* lowers to approach the crucible bottom portion. In the final stage of the crystal pull-up process illustrated in FIG. 6C, the melt surface 2*s* further lowers. However, as illustrated in FIG. 5, by changing the magnetic field intensity of the first and second coil devices 21 and 22 in accordance with the crystal length (silicon melt residual amount), it is possible to make the direction of the magnetic field to be applied around the crucible bottom portion to follow the curved shape of the crucible bottom portion while keeping the magnetic field around the melt surface 2*s* horizontal from early to final stages of the crystal pull-up process.

When the direction of the magnetic field to be applied around the crucible bottom portion does not follow the curved crucible bottom portion, convection is partly suppressed at the crucible bottom portion to cause the shape of a large roll flow of the silicon melt to fluctuate with time and thus to become unstable. It follows that a delivery state of oxygen dissolved into the silicon melt at the crucible bottom portion to the silicon single crystal also fluctuates with time to cause a variation in the in-plane distribution of oxygen concentration.

On the other hand, when the direction of the magnetic field to be applied around the crucible bottom portion follows the curved crucible bottom portion, a large roll flow is stably generated in the silicon melt, making oxygen easy to evaporate from the melt surface 2*s*, so that the amount of oxygen to be taken in the silicon single crystal decreases. When the direction of the magnetic field to be applied around the crucible bottom portion follows the curved crucible bottom portion, convection at the crucible bottom portion is not suppressed, so that the amount of oxygen to be dissolved from the crucible into the silicon melt increases. However, oxygen concentration in the silicon single crystal is significantly influenced by evaporation of oxygen from the melt surface, so that even when the amount of oxygen to be dissolved into the silicon melt somewhat increases, oxygen concentration in the silicon single crystal does not increase.

Figure 7A:
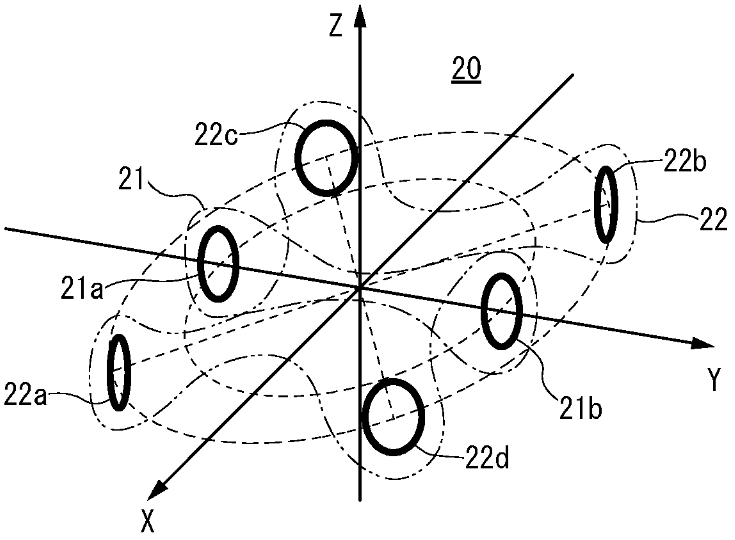
Figure 7B:
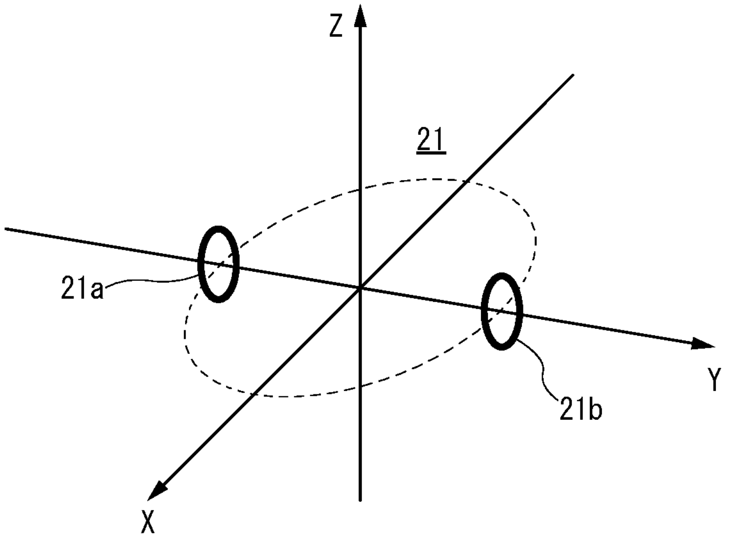
Figure 7C:
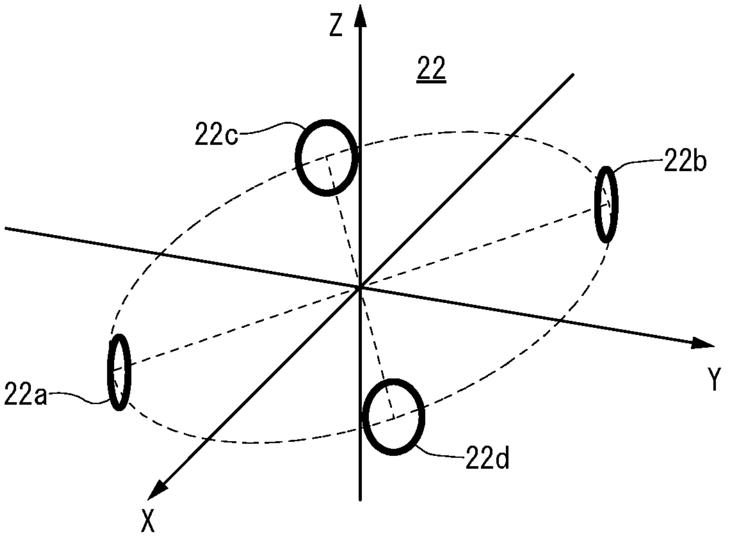

FIGS. 7A to 7C are schematic perspective views illustrating the configuration of the magnetic field generator 20 according to a second embodiment of the present invention. FIG. 7A illustrates the entire configuration of the magnetic field generator 20, FIG. 7B illustrates the configuration of the first coil device 21, and FIG. 7C illustrates the configuration of the second coil device 22.

As illustrated in FIGS. 7A to 7C, the magnetic field generator 20 according to the second embodiment differs from the magnetic field generator according to the first embodiment in that the loop size of the coil element constituting each of the first and second coil devices 21 and 22 is smaller than that in the magnetic field generator according to the first embodiment. Other configurations are the same as those of the first embodiment. Even with such a configuration, the same effects as those in the first embodiment can be achieved.

Figure 8A:
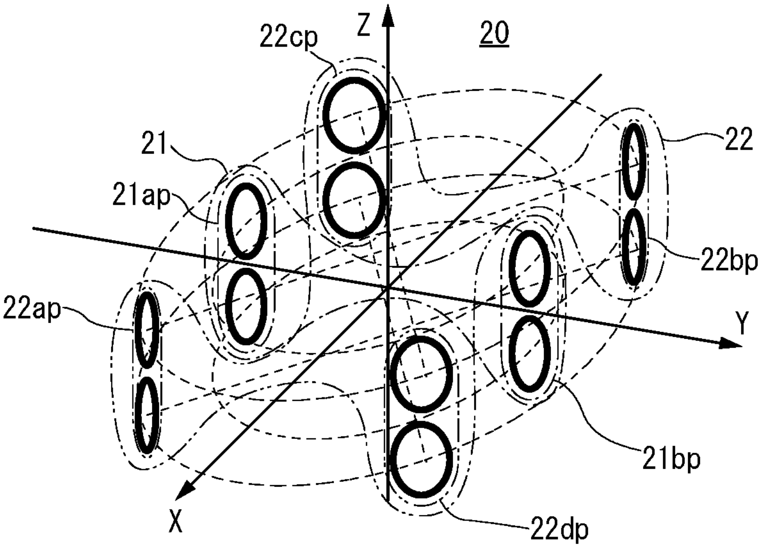
Figure 8B:
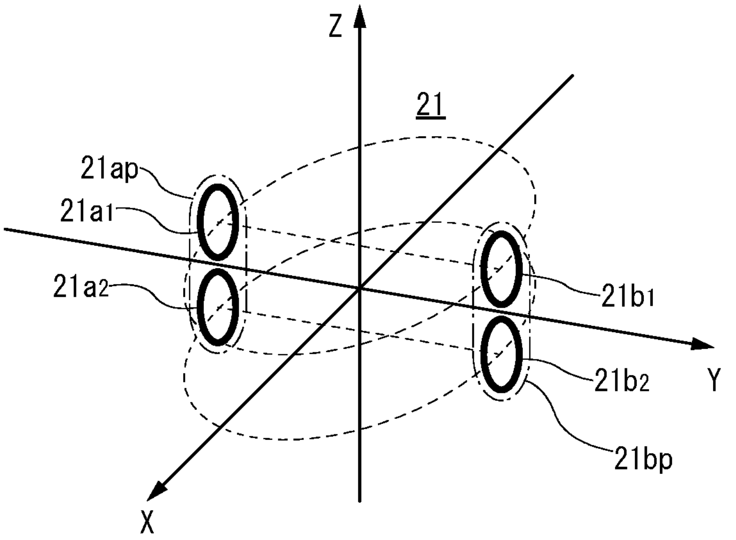
Figure 8C:
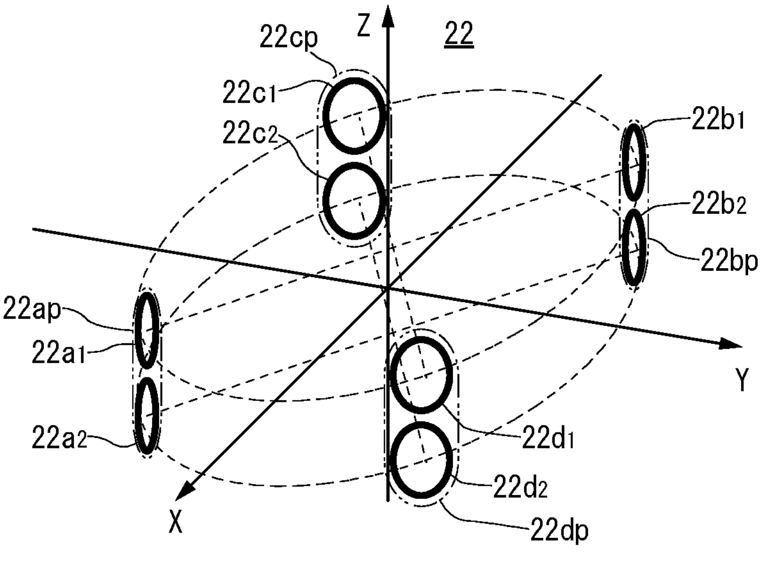

FIGS. 8A to 8C are schematic perspective views illustrating the configuration of the magnetic field generator 20 according to a third embodiment of the present invention. FIG. 8A illustrates the entire configuration of the magnetic field generator 20, FIG. 8B illustrates the configuration of the first coil device 21, and FIG. 8C illustrates the configuration of the second coil device 22.

As illustrated in FIGS. 8A to 8C, the magnetic field generator 20 according to the third embodiment is obtained by replacing the coil elements 21*a*, 21*b*, 22*a*, 22*b*, 22*c*, and 22*d* of the first and second coil devices 21 and 22 illustrated in FIGS. 7A to 7C respectively with upper and lower two-stage coil element pairs 21*ap*, 21*bp*, 22*ap*, 22*bp*, 22*cp*, and 22*dp*. That is, the first coil device 21 has two pairs of loop coil elements, and the second coil device 22 has four pairs of loop coil elements.

As illustrated in FIG. 8B, the first coil device 21 has a first coil element pair 21*ap* (21$a_1$, 21$a_2$) and a second coil element pair 21*bp* (21$b_1$, 21$b_2$) opposed to the first coil element pair 21*ap* across the Z-axis. The first coil element pair 21*ap* (21$a_1$, 21$a_2$) is disposed on the Y-axis negative direction, and the second coil element pair 21*bp* (21$b_1$, 21$b_2$) is disposed on the Y-axis positive direction.

The upper coil part 21$a_1$ of the first coil element pair 21*ap* and lower coil part 21$a_2$ of the first coil element pair 21*ap* are disposed symmetrically with respect to the XY plane, and the upper coil part 21$b_1$ of the second coil element pair 21*bp* and the lower coil part 21$b_2$ of the second coil element pair 21*bp* are disposed symmetrically with respect to the XY plane. The upper coil part 21$a_1$ and upper coil part 21$b_1$ constitute a pair of coil elements whose coil axes coincide with each other, and the lower coil part 21$a_2$ and lower coil part 21$b_2$ also constitute a pair of coil elements whose coil axes coincide with each other.

As illustrated in FIG. 8C, the second coil device 22 has a third coil element pair 22*ap* (22$a_1$, 22$a_2$), fourth coil element pair 22*bp* (22$b_1$, 22$b_2$) opposed to the third coil element pair 22*ap* across the Z-axis, a fifth coil element pair 22*cp* (22$c_1$, 22$c_2$), and a sixth coil element pair 22*dp* (22$d_1$, 22$d_2$) opposed to the fifth coil element pair 22*cp* across the Z-axis. The third coil element pair 22*ap* and fifth coil element pair 22*cp* are disposed on the negative side in the Y-axis direction, and the fourth coil element pair 22*bp* and sixth coil element pair 22*dp* are disposed on the positive side in the Y-axis direction.

The upper coil part 22$a_1$ of the third coil element pair 22*ap* and the lower coil part 22$a_2$ of the third coil element pair 22*ap* are disposed symmetrically with respect to the XY plane, and the upper coil part 22$b_1$ of the fourth coil element pair 22*bp* and the lower coil part 22$b_2$ of the fourth coil element pair 22*bp* are disposed symmetrically with respect to the XY plane. The upper coil part 22$a_1$ and upper coil part 22$b_1$ constitute a pair of coil elements whose coil axes coincide with each other, and the lower coil part 22$a_2$ and lower coil part 22$b_2$ also constitute a pair of coil elements whose coil axes coincide with each other.

The upper coil part 22$c_1$ of the fifth coil element pair 22*cp* and the lower coil part 22$c_2$ of the fifth coil element pair 22*cp* are disposed symmetrically with respect to the XY plane, and the upper coil part 22$d_1$ of the sixth coil element pair 22*dp* and the lower coil part 22$d_2$ of the sixth coil element pair 22*dp* are disposed symmetrically with respect to the XY plane. The upper coil part 22$c_1$ and upper coil part 22$d_1$ constitute a pair of coil elements whose coil axes coincide with each other, and the lower coil part 22$c_2$ and lower coil part 22$d_2$ also constitute a pair of coil elements whose coil axes coincide with each other.

The thus configured magnetic field generator 20 according to the third embodiment can provide the same effects as those in the first embodiment.

Figure 9A:
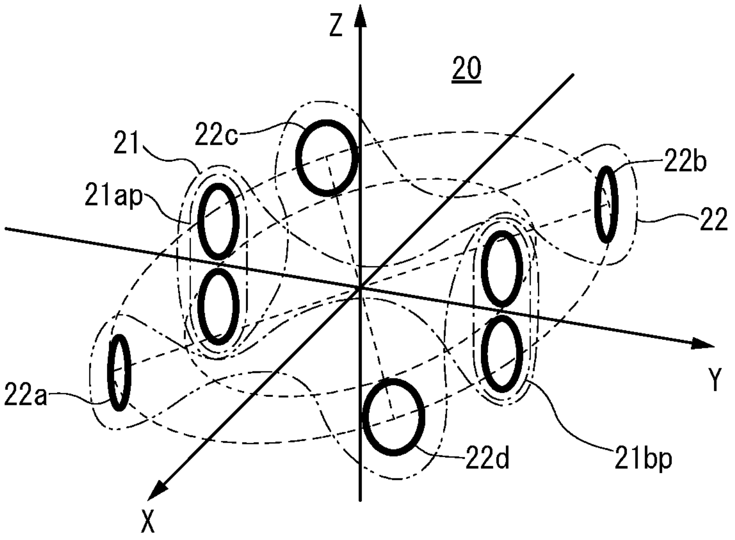
Figure 9B:
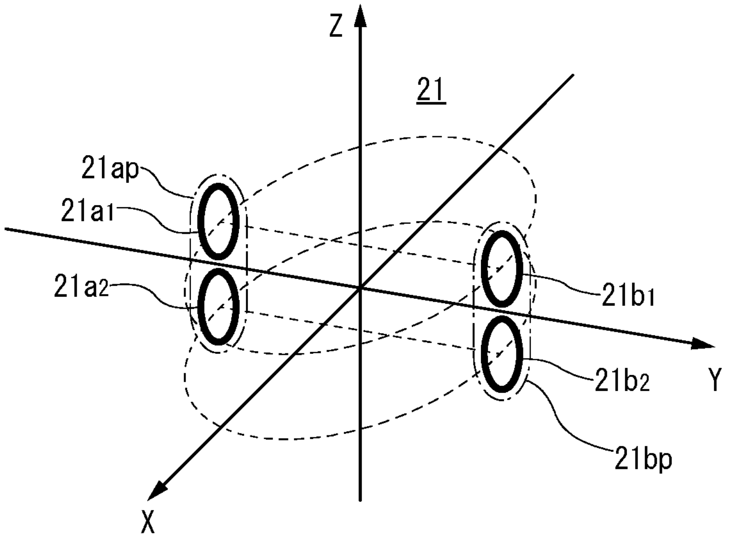
Figure 9C:
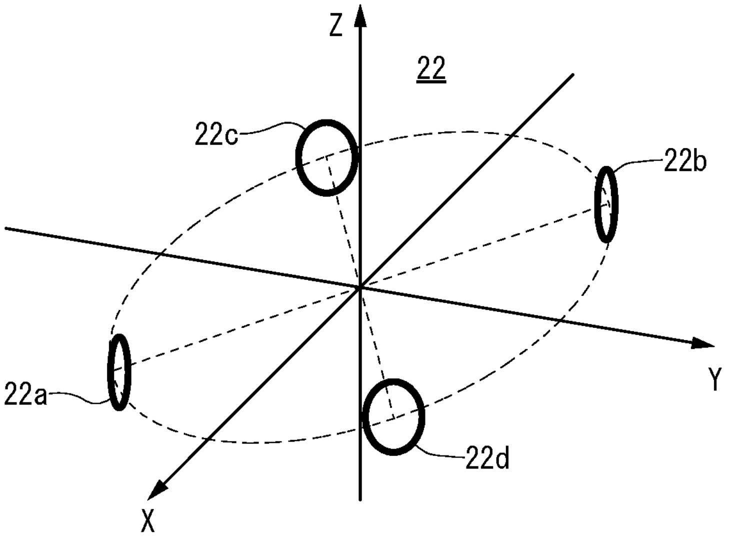

FIGS. 9A to 9C are schematic perspective views illustrating the configuration of the magnetic field generator 20 according to a fourth embodiment of the present invention. FIG. 9A illustrates the entire configuration of the magnetic field generator 20, FIG. 9B illustrates the configuration of the first coil device 21, and FIG. 9C illustrates the configuration of the second coil device 22.

As illustrated in FIGS. 9A to 9C, the magnetic field generator 20 according to the fourth embodiment is featured in that the first coil device 21 has two pairs of loop coil elements (coil elements 21$a_1$, 21$a_2$, 21$b_1$, 21$b_2$), and the second coil device 22 has two pairs of loop coil elements (coil elements 22*a*, 22*b*, 22*c*, 22*d*). That is, the first coil device 21 has the same configuration as that illustrated in FIG. 8, and the second coil device 22 has the same configuration as that illustrated in FIG. 7. In the present embodiment as well, the same effects as those in the above embodiments can be achieved.

A magnetic field parallel to the curved shape of the quartz crucible bottom portion can be calculated using numerical expressions.

For example, the output of the magnetic field generator 20 is adjusted so as to minimize an integrated value from Y=0 to Y=Ymax of the square of the inner product value of a normal vector n of the quartz crucible inner bottom surface Z=C(Y) and a magnetic field vector. That is, the following expression (1) is minimized with the magnetic field intensity at the origin fixed to a specified value.

[Numeral 1]

$$\int_0^{Y_{max}}\{\vec{n}(Y,C(Y))\cdot[\alpha\vec{B}_1(Y,C(Y))+\beta\vec{B}_2(Y,C(Y))]\}^2dY \quad (1)$$

In the above expression, $B_1$ is a magnetic field vector formed by the first coil device 21 alone, and $B_2$ is a magnetic field vector formed by the second coil device 22 alone.

A magnetic field distribution approaches a horizontal state around the crucible center axis, and thus the shape of the crucible bottom portion and the magnetic field distribution are parallel to some extent around the center of the crucible bottom portion. On the other hand, the magnetic field distribution and the crucible shape tend to be displaced from a mutually parallel state around the outer periphery of the crucible bottom portion. Thus, the function to be integrated in the expression (1) becomes large where the Y is large, so that in order to minimize the expression (1), the function to be integrated needs to be reduced where the Y is large, that is, the crucible shape and the magnetic force lines need to approach a mutually parallel state.

The Ymax is preferably equal to or less than 70% of a crucible radius R (0≤Ymax≤0.7R). When the Ymax is too small, the parallel state at the crucible outer peripheral portion is not satisfied. When the Ymax is too large, the parallel state between the center portion of the crucible bottom portion and the crucible outer peripheral portion becomes worse since adjustment is made with reference to the outer periphery. Further, the crucible shape abruptly changing toward the crucible side wall significantly influences the expression (1).

As a variation of the expression (1), an evaluation method using not the B, but the direction vector of the B can also be considered.

That is, the crucible bottom shape at the center of the bottom and the second-order differential of the magnetic force lines in the Y-direction are made to coincide with each other. Specifically, the output of the magnetic field generator 20 is adjusted so as to satisfy the following expression (2).

[Numeral 2]

$$\alpha\frac{\partial B_{1,Z}(0,Z)}{\partial Y}+\beta\frac{\partial B_{2,Z}(0,Z)}{\partial Y}=\frac{d^2C(Y)}{dY^2}(\alpha B_{1,Y}+\beta B_{2,Y}) \quad (2)$$

In the above expression, $B_{1,Y}$ and $B_{1,Z}$ are respectively a Y-direction component and a Z-direction component of the magnetic field vector $B_1$ formed by the first coil device 21 alone, and $B_{2,Y}$ and $B_{2,Z}$ are respectively a Y-direction component and a Z-direction component of the magnetic field vector $B_2$ formed by the second coil device 22 alone.

While the preferred embodiments of the present invention have been described, the present invention is not limited to the above embodiments, and various modifications may be made within the scope of the present invention, and all such modifications are included in the present invention.

For example, although a silicon single crystal manufacturing method is taken as an example in the above embodiments, the present invention is not limited to this, but may be applied to manufacturing methods for various types of single crystals adopting the HMCZ method.

EXAMPLES

The magnetic field generator 20 illustrated in FIG. 9 were used to grow a silicon single crystal according to the HMCZ method. As described above, the magnetic field generator 20 is constituted by the first coil device 21 including the four coil elements 21$a_1$, 21$a_2$, 21$b_1$, and 21$b_2$ which are disposed in a vertical plane and the second coil device 22 including the four coil elements 22$a$, 22$b$, 22$c$, and 22$d$ which are disposed in a horizontal plane.

The magnetic field intensity at the origin (intersection between the crystal center axis (Z-axis) and the magnetic field center axis (Y-axis)) of an orthogonal coordinate system was set to 3000 G. The diameter of the quartz crucible was 813 mm, and the curvature radius of the curved bottom portion of the quartz crucible was 813 mm.

Figure 10A:
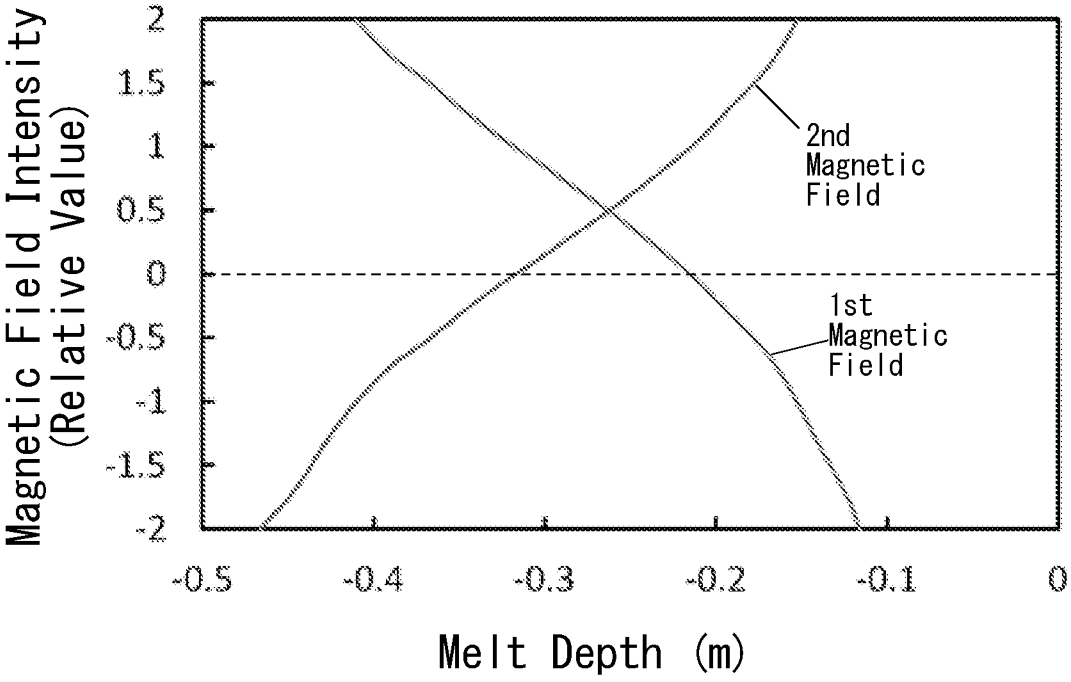
Figure 10B:
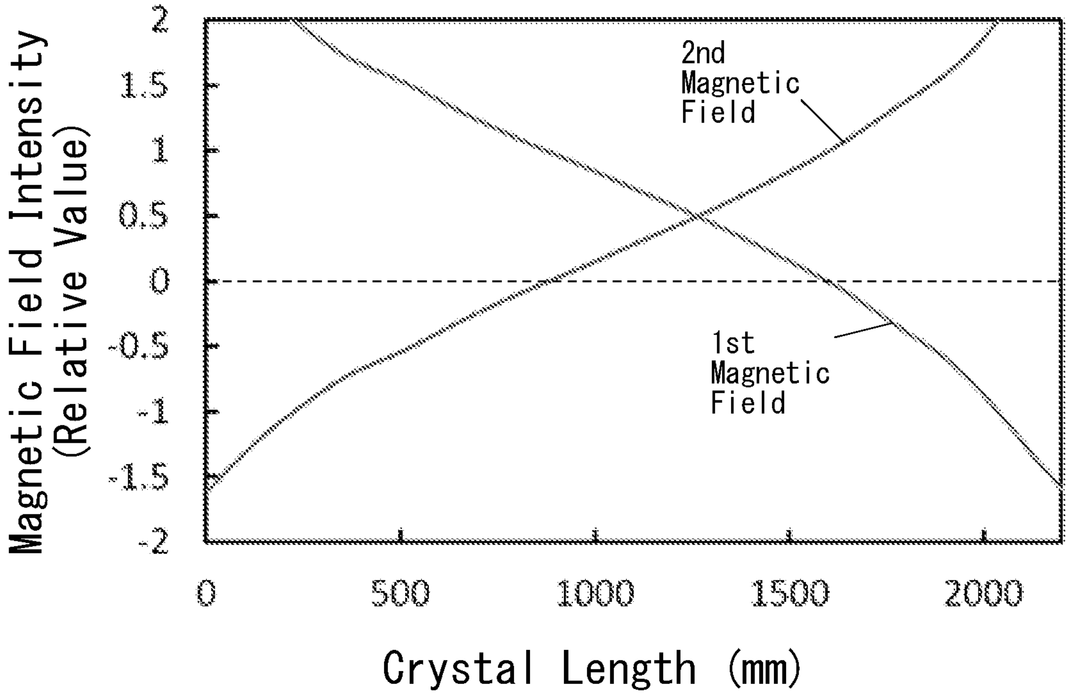

Electromagnetic field analysis software was used to calculate a magnetic field formed by the first and second coil devices. A magnetic field vector at the melt surface was set parallel to the Y-axis. Further, an angle formed by the normal line of the inner surface of the quartz crucible bottom portion and a magnetic field vector was calculated within the YZ plane, and a magnetic field output relative to melt depth (distance from the liquid surface to crucible bottom) was calculated using the above expression (2). The obtained result is illustrated in the graphs of FIGS. 10A and 10B. In these graphs, the output required for each of the first and second coil devices alone to produce magnetic field intensity at the center of crystal-melt surface was set to 1.

As illustrated in FIGS. 10A and 10B, the output (first magnetic field) of the first coil device had a large magnetic field intensity in the Y-axis positive direction at first, and thereafter the magnetic field intensity in the Y-axis positive direction gradually decreased and then became zero along with a reduction in the melt amount associated with the advance of crystal growth, followed by a gradual increase in the magnetic field intensity in the Y-axis negative direction. Conversely, the output (second magnetic field) of the second coil device had a large magnetic field intensity in the Y-axis negative direction at first, and thereafter the magnetic field intensity in the Y-axis negative direction gradually decreased and then became zero along with a reduction in the melt amount associated with the advance of crystal growth, followed by a gradual increase in the magnetic field intensity in the Y-axis positive direction.

Figure 11A:
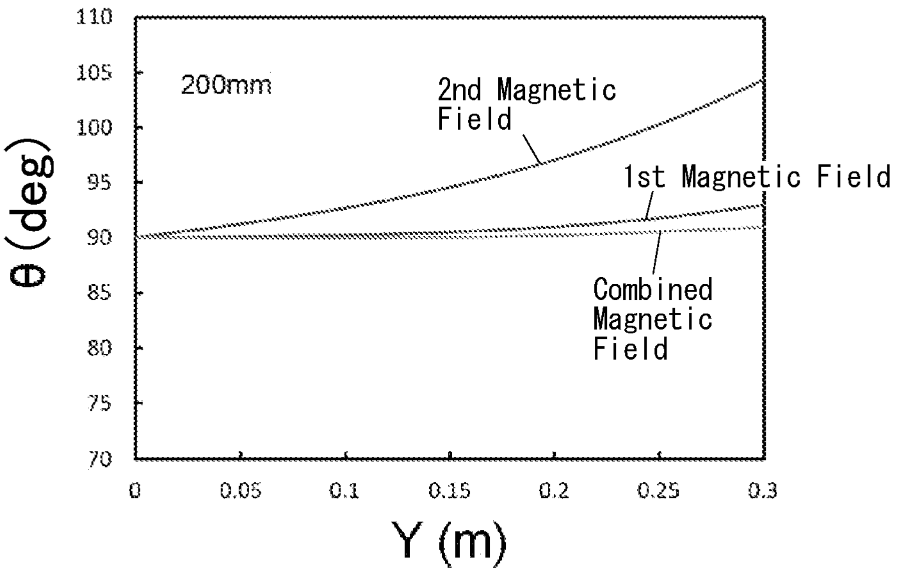
Figure 11B:
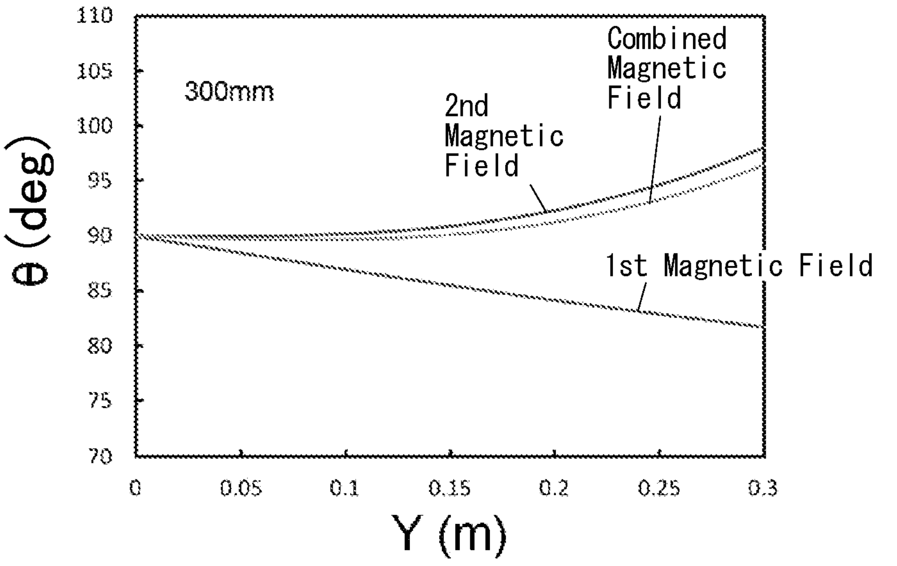
Figure 11C:
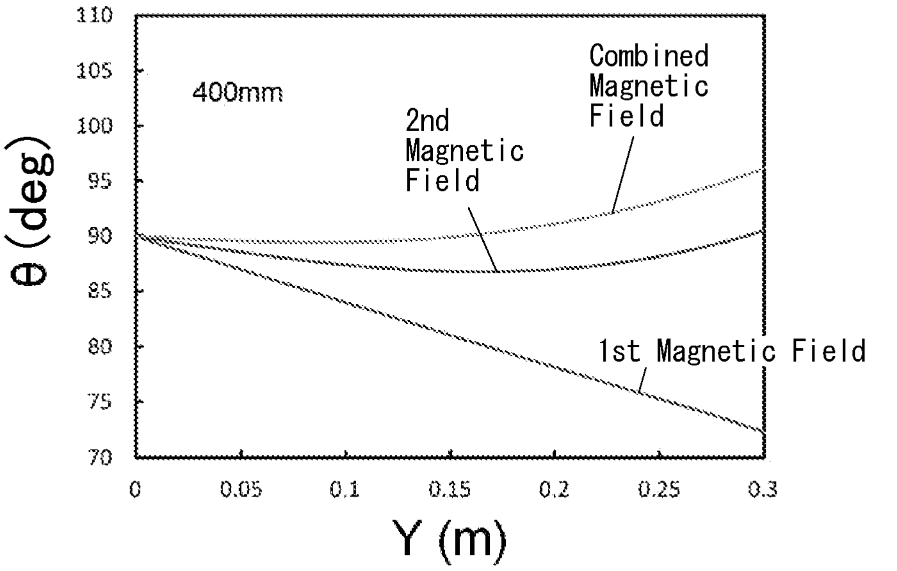

FIGS. 11A to 11C are graphs illustrating an angle θ formed by the magnetic force lines of the combined magnetic field generated using the magnetic field output profile illustrated in FIGS. 10A and 10B and inner surface of the crucible bottom portion in comparison with the magnetic field generated when each of the first and second coil devices operates alone.

As illustrated in FIG. 11C, when the melt depth was 400 mm, the magnetic field angle relative to the inner surface of the crucible inner portion upon application of the combined magnetic field was about 90° to about 95°. Further, as illustrated in FIG. 11B, when the melt depth was 300 mm as well, the magnetic field angle was about 90° to about 95°. As illustrated in FIG. 11A, when the melt depth was 200 mm, the magnetic field angle was almost 90°, exhibiting a satisfactory result.

Figure 12:
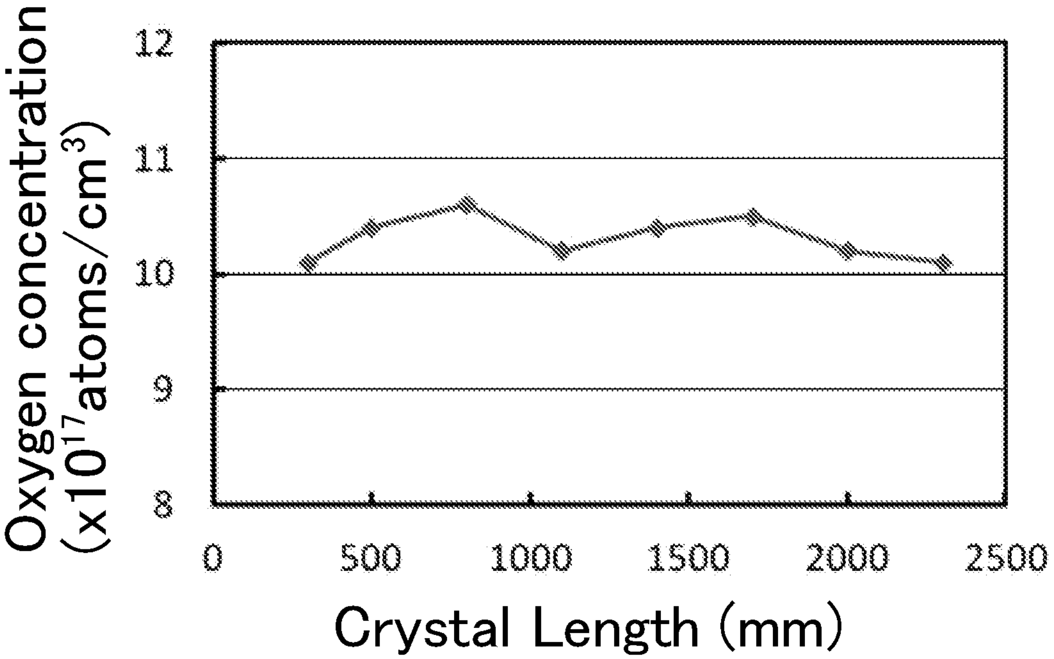
FIG. 12 is a graph illustrating the oxygen concentration distribution in the crystal growth direction of the silicon single crystal according to the example produced through application of the combined magnetic field.

FIG. 12 is a graph illustrating the oxygen concentration distribution in the crystal growth direction of the silicon single crystal according to the example produced through application of the combined magnetic field. As can be seen from the illustrated graph, oxygen concentration in the crystal growth direction was very stable within the range of $10\times10^{17}$ to $11\times10^{17}$ atoms/cm$^3$.

Figure 13A:
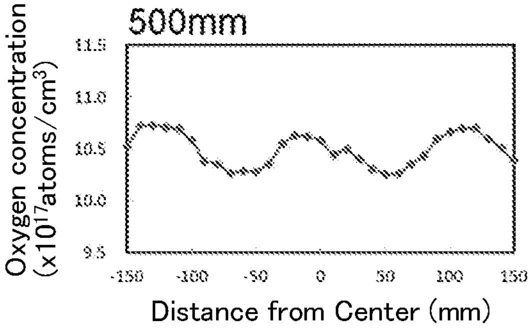
Figure 13B:
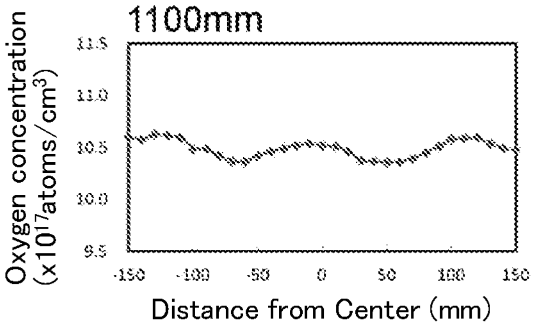
Figure 13C:
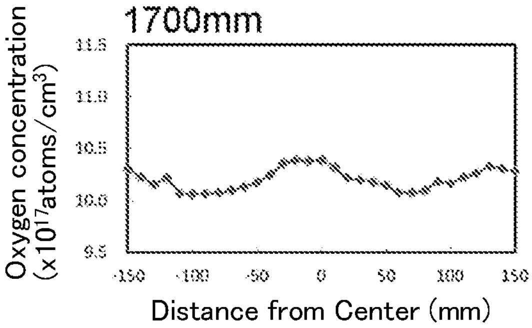
Figure 13D:
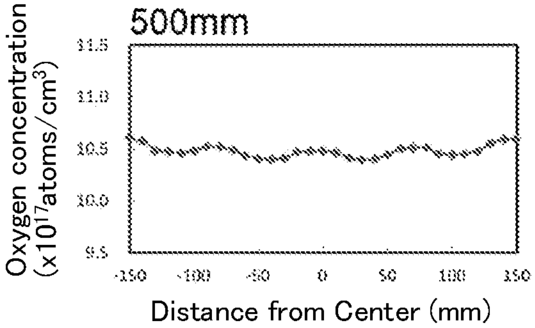
Figure 13E:
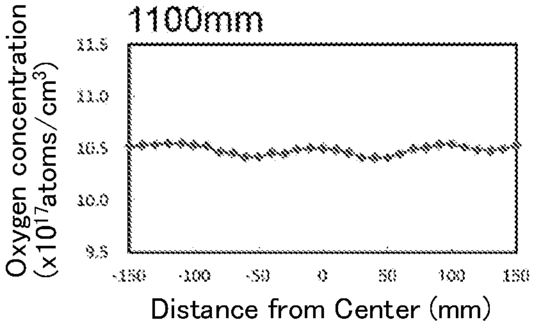
Figure 13F:
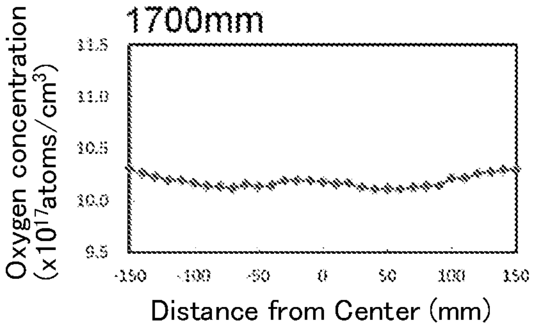
Figure 14:
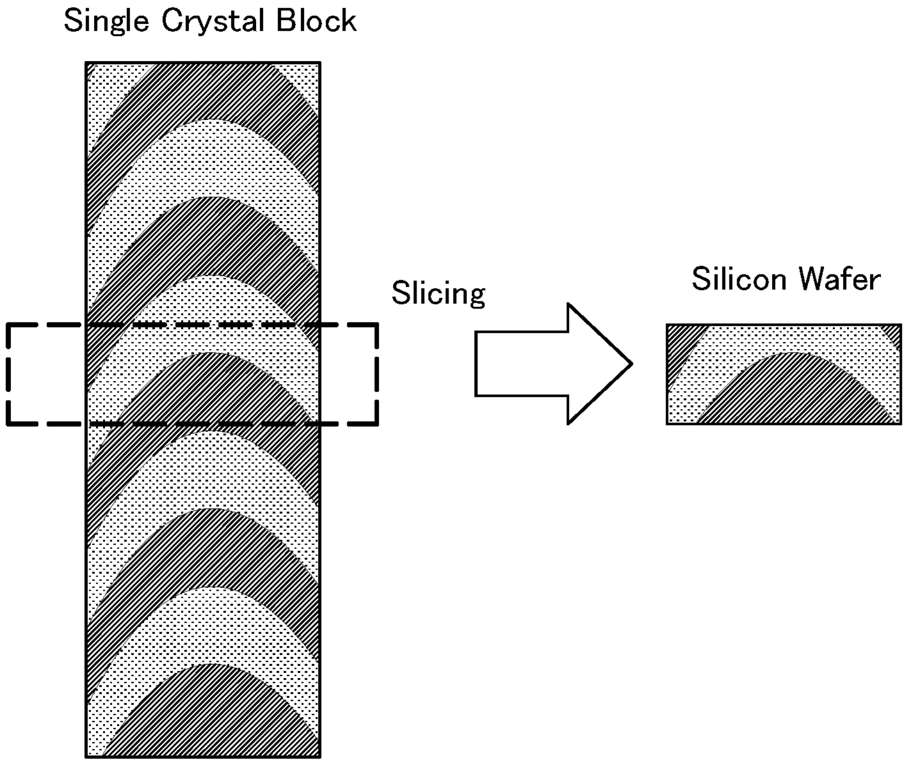
FIG. 14 is a schematic diagram illustrating problems of the conventional silicon single crystal.

FIGS. 13A to 13F are graphs illustrating evaluation results about oxygen concentration in silicon single crystals according to the example and a comparative example. In particular, FIGS. 13A to 13C are evaluation results about oxygen concentration in a silicon single crystal according to a comparative example produced through application of a single magnetic field (conventional magnetic field) and illustrate the in-plane distribution (radial distribution) of oxygen concentration at 500 mm, 1100 mm, and 1700 mm positions of the crystal length. FIGS. 13D to 13F are evaluation results about oxygen concentration in the silicon single crystal according to the example produced through application of the combined magnetic field and illustrate the in-plane distribution (radial distribution) of oxygen concentration at 500 mm, 1100 mm, and 1700 mm positions of the crystal length.

As illustrated in FIGS. 13A to 13C, the oxygen concentration distribution of the silicon single crystal according to the comparative example had a large variation. On the other hand, as illustrated in FIGS. 13D to 13F, the oxygen concentration distribution of the silicon single crystal according to the example had a small variation.

DESCRIPTION OF REFERENCE NUMERALS

1: Single crystal manufacturing apparatus
2: Silicon melt
3: Silicon single crystal (ingot)

3*a*: Neck section
3*b*: Shoulder section
3*c*: Body section
3*d*: Tail section
10: Chamber
10*a*: Main chamber
10*b*: Pull chamber
10*c*: Gas inlet
10*d*: Gas outlet
10*e*: Observation window
11: Quartz crucible
12: Susceptor
13: Rotary shaft
14: Shaft drive mechanism
15: Heater
16: Heat insulating material
17: Heat shielding body
18: Wire
19: Wire winding mechanism
20: Magnetic field generator
21*a*: First coil element
21$a_1$: Upper coil part
21$a_2$: Lower coil part
21*ap*: First coil element pair
21*b*: Second coil element
21$b_1$: Upper coil part
21$b_2$: Lower coil part
21*bp*: Second coil element pair
22*a*: Third coil element
22$a_1$: Upper coil part
22$a_2$: Lower coil part
22*ap*: Third coil element pair
22*b*: Fourth coil element
22$b_1$: Upper coil part
22$b_2$: Lower coil part
22*bp*: Fourth coil element pair
22*c*: Fifth coil element
22$c_1$: Upper coil part
22$c_2$: Lower coil part
22*cp*: Fifth coil element pair
22*d*: Sixth coil element
22$d_1$: Upper coil part
22$d_2$: Lower coil part
22*dp*: Sixth coil element pair
25: CCD camera
26: Image processor
27: Controller

The invention claimed is:

1. A single crystal manufacturing method for pulling-up a single crystal while applying a lateral magnetic field to a melt in a crucible, comprising:

lifting the crucible in accordance with a reduction in the melt during a crystal pull-up process; and controlling a magnetic field distribution in accordance with the reduction in the melt so as to make a constant direction of the lateral magnetic field at a melt surface and to make a constant direction of the lateral magnetic field at an inner surface of a curved bottom portion of the crucible from a start to an end of a body section growing step of the single crystal, wherein the direction of the magnetic field at the melt surface is parallel to the melt surface, a rotary axis of the crucible is defined as Z-axis, a magnetic field center axis of the lateral magnetic field orthogonal to the Z-axis is defined as Y-axis, an intersection between the Z-axis and the Y-axis is set to an origin, an axis orthogonal to a YZ plane and passing the origin is defined as X-axis, and an angle θ formed by a normal vector of the inner surface and a magnetic field vector on an intersection line between the inner surface of the curved bottom portion of the crucible and the YZ plane is maintained at equal to or more than 75° and equal to or less than 105°.

2. The single crystal manufacturing method according to claim 1, wherein the magnetic field distribution is adjusted so as to minimize, at the curved bottom portion of the crucible, an integrated value of a square of an inner product value of the normal vector of the inner surface of the crucible curved bottom portion and the magnetic field vector.

3. The single crystal manufacturing method according to claim 1, wherein the magnetic field distribution is adjusted so as to make the curved bottom portion of the crucible and a second-order differential of the lateral magnetic field in a Y-direction coincide with each other at a center of the bottom portion of the crucible.

4. The single crystal manufacturing method according to claim 1, wherein a radius of the crucible is defined as R, and the bottom portion of the crucible is defined in a range of 0.7R or less from a center of the bottom portion of the crucible.

5. The single crystal manufacturing method according to claim 1, wherein a plurality of coil elements is disposed around the crucible and each magnetic intensity of the coil elements is individually adjusted so as to control the magnetic field distribution.

6. The single crystal manufacturing method according to claim 5, wherein the plurality of coil elements constitutes a plurality of coil element pairs with their axes meeting each other.

7. The single crystal manufacturing method according to claim 5, wherein the plurality of coil elements are disposed symmetrically with respect to an XZ plane.

8. The single crystal manufacturing method according to claim 5, wherein the plurality of coil elements are disposed parallel to an XY plane.

9. The single crystal manufacturing method according to claim 5, wherein the plurality of coil elements constitute a first coil device generating a first magnetic field and a second coil device generating a second magnetic field different from the first magnetic field, and the lateral magnetic field distribution is controlled by individually adjusting the intensity of the first magnetic field and the intensity of the second magnetic field.

10. The single crystal manufacturing method according to claim 9, wherein the first magnetic field changes such that the magnetic field intensity thereof in a Y-axis positive direction gradually decreases and then becomes zero, followed by a gradual increase in the magnetic field intensity in a Y-axis negative direction, and the second magnetic field changes such that the magnetic field intensity thereof in the Y-axis negative direction gradually decreases and then becomes zero, followed by a gradual increase in the magnetic field intensity in the Y-axis positive direction.

* * * * *